(12) United States Patent
Yoshino et al.

(10) Patent No.: US 8,044,126 B2
(45) Date of Patent: Oct. 25, 2011

(54) POLYARYLENE SULFIDE RESIN COMPOSITION, PRODUCTION METHOD THEREOF AND SURFACE MOUNT ELECTRONIC COMPONENT

(75) Inventors: Yasuyuki Yoshino, Ichihara (JP); Hirokiyo Nakase, Ichihara (JP); Hiroaki Negishi, Ichihara (JP); Yohei Yamaguchi, Ichihara (JP); Shinya Gibo, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 12/865,440

(22) PCT Filed: Jan. 28, 2009

(86) PCT No.: PCT/JP2009/051306
§ 371 (c)(1),
(2), (4) Date: Jul. 30, 2010

(87) PCT Pub. No.: WO2009/096401
PCT Pub. Date: Aug. 6, 2009

(65) Prior Publication Data
US 2010/0331463 A1    Dec. 30, 2010

(30) Foreign Application Priority Data

Jan. 31, 2008    (JP) .................. 2008-020715

(51) Int. Cl.
C08K 3/32    (2006.01)
C08K 5/26    (2006.01)
(52) U.S. Cl. ........ 524/123; 524/128; 524/130; 524/132; 524/147; 524/153; 524/414; 524/417
(58) Field of Classification Search .................. 524/123, 524/128, 130, 132, 147, 153, 414, 417
See application file for complete search history.

(56) References Cited

U.S. PATENT DOCUMENTS

| | | | |
|---|---|---|---|
| 5,256,718 A * | 10/1993 | Yamamoto et al. | 524/411 |
| 7,303,822 B1 | 12/2007 | Matsuoka et al. | |
| 2004/0147646 A1 * | 7/2004 | Harashina et al. | 524/115 |
| 2004/0254270 A1 * | 12/2004 | Harashina | 524/86 |
| 2004/0266916 A1 * | 12/2004 | Harashina et al. | 523/217 |

FOREIGN PATENT DOCUMENTS

| | | |
|---|---|---|
| CA | 2056976 A1 | 6/1992 |
| EP | 0361636 A2 | 4/1990 |
| EP | 0489437 A2 | 6/1992 |
| EP | 1978059 A1 | 10/2008 |
| JP | 2-123159 A | 5/1990 |
| JP | 5-005060 A | 1/1993 |
| JP | 2001-302918 A | 10/2001 |
| JP | 2008-007742 A | 1/2008 |
| WO | WO 2007/077831 * | 7/2007 |

OTHER PUBLICATIONS

International Search Report of PCT/JP2009/051306, Mailing Date of Apr. 21, 2009.

* cited by examiner

*Primary Examiner* — Peter Szekely
(74) *Attorney, Agent, or Firm* — Westerman, Hattori, Daniels & Adrian, LLP

(57) ABSTRACT

The present invention relates to a polyarylene sulfide resin composition, which comprises polyarylene sulfide (A) and polyamide (B) as essential components, and further includes an organic phosphorus compound (C), which is selected from the group consisting of an aromatic phosphite compound and an aromatic phosphonate compound, and an inorganic phosphorus compound (D), which is selected from the group consisting from a metal salt of phosphorous acid and a metal salt of hypophosphoric acid as essential components, in addition to the polyarylene sulfide (A) and the polyamide (B); a manufacturing method thereof; and a surface mount electronic component. The polyarylene sulfide resin composition has excellent heat resistance, does not decrease mechanical properties such as bending strength even if heating treatment is performed under the high temperature condition by passing through a reflow furnace, and has excellent flame retardance.

16 Claims, 2 Drawing Sheets

POLYARYLENE SULFIDE RESIN COMPOSITION, PRODUCTION METHOD THEREOF AND SURFACE MOUNT ELECTRONIC COMPONENT

TECHNICAL FIELD

The present invention relates to a polyarylene sulfide resin composition, which includes polyarylene sulfide and aromatic polyamide, a production method thereof and a surface mount electronic component.

BACKGROUND ART

Polyarylene sulfide represented by polyphenylene sulfide has a high melting point, excellent flame retardance and chemical resistance, and shows good flow properties at the time of molding. Accordingly, polyarylene sulfide is widely used in various electronic components, machine components and automobile parts as an engineering plastic for injection molding.

In recent years, in the fields of electronic and electrical industries, mounting method of a resin based electronic component to a printed board is shifted to a so-called surface mounting method (hereinafter, abbreviated to a "SMT method") due to an increase of productivity and miniaturization of products. In a technology wherein an electronic component is mounted on a board by the SMT method, tin-lead eutectic solder (melting point: 184° C.) had generally been used. However, in recent years, so-called lead-free solder, wherein a few kinds of metals are added to tin as a base material, has been used as an alternative material from a view point of environmental contamination.

The lead free solder has a melting point which is higher than that of the tin-lead eutectic solder. For example, a melting point of the tin-silver eutectic solder is 220° C. Accordingly, there is a problem that it is necessary to further increase the temperature of a heating furnace (reflow furnace) when surface molding is performed, and therefore, an resin-based electric component such as a connector is fused or deformed in the hearing furnace (reflow furnace) when the resin-based electronic component is soldered. Accordingly, a resin material having excellent heat resistance has been highly required for a surface mounting electronic component.

On the other hand, a resin composition which is obtained by melt-kneading of polyarylene sulfide and polyamide has been known as a high heat resisting material. (For example, refer to Patent documents 1 and 2.) However, in such a resin composition wherein polyarylene sulfide and polyamide are mixed, a function occurs wherein polyamide is decomposed by polyarylene sulfide. Consequently, a gas generated by the decompression increases at the time of melt-kneading, the exterior appearance of an electric component after passing through a hearing furnace (reflow furnace) tends to have a blister, and mechanical properties achieved after passing through a reflow furnace such as bending strength tends to decrease.

Patent document 1: Japanese Unexamined Patent Application, First Publication No. H2-123159
Patent document 2: Japanese Unexamined Patent Application, First Publication No. H5-5060

DISCLOSURE OF INVENTION

Problems to be Solved by the Invention

Accordingly, the object to be solved by the present invention is to provide a polyarylene sulfide resin composition, which is excellent in heat resistance, does not decrease mechanical properties such as bending strength if heating treatment is performed under high temperature conditions by passing through a reflow furnace, and has excellent flame retardance, a production method thereof and a surface mount electronic component.

Means for Solving the Problems

The inventors of the present invention have earnestly conducted studies in order to resolve the problems. As a result, they discovered that it is possible to inhibit generation of decomposition gas and is possible to highly improve mechanical strength and heat resistance after reflow by using a resin composition, wherein aromatic phosphite compound or aromatic phosphonate compound (C) and a metal salt of phosphorous acid or a metal salt of hypophosphoric acid (D) are compounded to a resin composition which includes a resin composition wherein polyarylene sulfide and aromatic polyamide are blended.

That is, the present invention relates to a polyarylene sulfide resin composition, which includes, as essential components, polyarylene sulfide (A), polyamide (B), aromatic phosphite compound or aromatic phosphonate compound (C) and a metal salt of phosphorous acid or a metal salt of hypophosphoric acid (D).

Furthermore, the present invention relates to a production method of a polyarylene sulfide resin composition, wherein the aforementioned polyarylene sulfide resin composition is provided to a double-screw kneading extruder, and melt-kneading of the resin composition is performed under conditions that a ratio (discharge volume/screw rotation frequency) of discharge volume (kg/hr) to screw rotation frequency (rpm) is 0.02 to 0.2 (kg/hr·rpm).

Furthermore, the present invention relates to a surface mount electronic component which includes, as essential components, a molded product of the aforementioned polyarylene sulfide resin composition and a metal terminal.

Effects of the Present Invention

According to the present invention, it is possible to provide a polyarylene sulfide resin composition, which is excellent in heat resistance, does not decrease mechanical properties such as bending strength even if heating treatment is performed at a high temperature condition by passing through a reflow furnace, and has excellent flame retardance, a production method thereof, and a surface mount electronic component.

Accordingly, a polyarylene sulfide resin composition of the present invention has characteristics that the composition shows excellent heat resistance at a high temperature range, and when the resin composition is used in an electronic component for surface mounting, variations of mechanical strength and appearance in the electronic component are extremely small even if the composition is exposed to such a high temperature at the time of soldering. Accordingly, a polyarylensulfide resin composition of the present invention is particularly useful for a connector, a switch, a relay, a coil bobbin, a condenser and the like, which can be soldered to a printed board by SMT method.

BEST MODE FOR CARRYING OUT THE INVENTION

The polyarylene sulfide (hereinafter, abbreviated to "PAS") (A) used in the present invention has a resin structure including a structure, wherein a sulfur atom and an aromatic ring are bonded with each other, as a repeating unit. Concretely, the polyarylene sulfide (A) is a resin which includes a structural part represented by the following general formula (1) as a repeating unit.

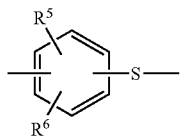

Structural formula (1)

($R^5$ and $R^6$ each independently represents a hydrogen atom, an alkyl group having 1 to 4 carbon atom, a nitro group, an amino group, a phenyl group, a methoxy group or an ethoxy group.)

Here, the structural part represented by the aforementioned structural formula (1) is particularly preferable that $R^5$ and $R^6$ in the formula are a hydrogen from the view point of the mechanical strength of the PAS (A). In such a case, the following structural formula (2) wherein sulfur is bonded at the para-position and the following structural formula (3) wherein sulfur is bonded at the meta-position are cited as examples.

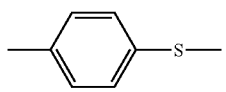

Structural formula (2)

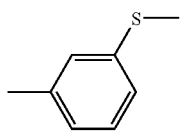

Structural formula (3)

Among them, it is particularly preferable that the structure of a sulfur atom to an aromatic ring in the repeating unit is a structure shown in the structural formula (2), wherein a sulfur atom is bonded to the para-position of an aromatic ring, from the viewpoint of heat resistance and crystallinity of the PAS (A).

Furthermore, the PAS (A) can include not only the structural part represented by the general formula (1) but also any of the structural parts represented by general formulae (4) to (7), so that the total amount of the structural parts of (1) and the structural parts of (4) to (7) is 30 mole % or less. Particularly, in the present invention, it is preferable that the content of the structural parts represented by the general formulae (4) to (7) is 10 mole % or less from the view point of heat resistance and mechanical strength of the PAS (A). When the PAS (A) includes the structural formulae (4) to (7), the bonding structure thereof may be a random copolymer or a block copolymer.

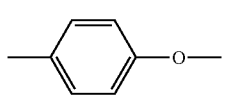

Structural formula (4)

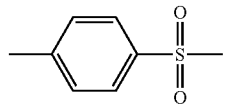

Structural formula (5)

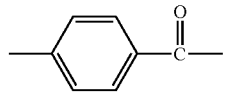

Structural formula (6)

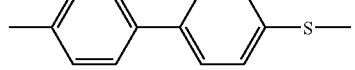

Structural formula (7)

Furthermore, the PAS (A) can include a trifunctional structural part represented by the structural formula (8) or a naphthylsulfide bonding. However, from the view point of reducing the amount of chloride atom in PAS (A), it is preferable that the amount of the structural part is in an amount of 1 mole % or less based on the total mole of the structural part and other structural pars, and it is particularly preferable that they are not substantially included in PAS (A).

Structural formula (8)

The aforementioned PAS (A) can be manufactured, for example, by the following methods (1) to (4).

(1) A method wherein sodium sulfide and p-dichlorobenzene are reacted in an amide type solvent such as N-methylpyrrolidone and dimethylacetamide, or in a sulfone type solvent such as sulfolane.

(2) A method wherein polymerization of p-dichlorobenzene is performed in the presence of sulfur and sodium carbonate.

(3) A method wherein polymerization is performed in a polar solvent in the presence of sodium sulfide, or sodium hydrosulfide and sodium hydroxide, or hydrogen sulfide and sodium hydroxide.

(4) A method wherein self-condensation of p-chlorothiophenol is performed.

Among them, the method (1) wherein sodium sulfide and p-dichlorobenzene are reacted in an amide type solvent such as N-methylpyrrolidone and dimethylacetamide or a sulfone type solvent such as sulfolane is preferable, from the view point of ease of reaction control and excellent industrial productivity.

From the viewpoint of the effective and industrial manufacturing of PAS (A) which is a linear compound and has high molecular weight, a method included in the aforementioned method (1) is particularly preferable, wherein a reaction slurry, which includes solid alkali metal sulfide, dichlorobenzene, alkali metal hydrosulfide and organic acid alkaline metal salt as essential components, is prepared, and heated to perform polymerization under heterogeneous system. Concretely, as the polymerization method, such a method which includes following steps 1 and 2 as essential manufacturing steps is preferable form the viewpoint of productivity.

Step 1: a slurry (I) is manufactured by reacting following components while conducting dehydration:
a hydrated alkali metal sulfide, or a combination of a hydrated alkali metal hydrosulfide and an alkali metal hydroxide;
N-methylpyrroridone; and
a non-hydrolyzable organic solvent.

Step 2: subsequently, polymerization is performed in the slurry (I) by reacting following components:
dichlorobenzene;
the alkali metal hydrosulfide; and
alkali metal salt of a hydrolysate of the N-methylpyrroridone.

Examples of the hydrated alkali metal sulfide which can be used in the method include a liquid or solid hydrated material of compounds such as lithium sulfide, sodium sulfide, potassium sulfide, rubidium sulfide and cesium sulfide. The solid concentration thereof is preferably 10 to 80% by mass, and more preferably 35 to 65% by mass.

Examples of the hydrated alkali metal hydrosulfide include a liquid or solid hydrated material of compounds such as lithium hydrosulfide, sodium hydrosulfide, potassium hydrosulfide, rubidium hydrosulfide and cesium hydrosulfide. The solid concentration thereof is preferably 10 to 80% by mass. Among them, hydrated materials of lithium hydrosulfide and sodium hydrosulfide are preferable, and hydrated material of sodium hydrosulfide is particularly preferable.

Furthermore, examples of the alkali metal hydroxide include: lithium hydroxide, sodium hydroxide, potassium hydroxide, rubidium hydroxide, cesium hydroxide and an aqueous solution thereof. When the aqueous solution thereof is used, it is preferable that the concentration of the aqueous solution is 20% by mass or more from the view point of ease of dehydration treatment of the step 1. Among the examples, lithium hydroxide sodium, hydroxide and potassium hydroxide are preferable, and sodium hydroxide is preferable.

Among PAS(A) obtained as described above, such a PAS (A) is particularly preferable wherein peak molecular weight thereof is in the range of 25000 to 30000 when measurement is performed by gel permeation chromatography, a ratio (Mw/Mn) of the weight average molecular weight (Mw) to the number average molecular weight (Mn) thereof is in the range of 5 to 10, and non-Newtonian index thereof is in the range of 0.9 to 1.3. The reason is that it is possible to reduce the chlorine atom content of PAS(A) itself to the range of 1500 to 2000 ppm without reducing the mechanical strength of a produced mold, and such a PAS(A) is easily applied to the use for electronic and electrical components which are halogen-free.

The peak molecular weight and the molecular weight distribution (Mw/Mn) of the PAS (A) can be measured by gel permeation chromatography under the following conditions using six kinds of monodisperse polystyrene for calibration.

(Measurement Conditions of Gel Permeation Chromatography)
Device: a high-temperature polymer molecular weight distribution measuring apparatus (manufactured by Senshu scientific co., ltd, "SSC-7000")
Column: UT-805L (manufactured by Showa Denko K.K.)
Column temperature: 210° C.
Solvent: 1-cloronaptahlaen
Measurement method: UV detector (360 nm)

It is preferable that the PAS (A) described above has the melt viscosity of 40 to 60 Pa·S, which is determined by a flow tester, and more preferably 45 to 55 Pa·S from the view point of compatibility with a polyamide (B). Here, the value of the melt viscosity is a value determined by a Kouka-shiki flow tester under the conditions of 300° C., a shear rate of 100 sec$^{-1}$, a nozzle aperture size of 0.5 mm and a length of 1.0 mm.

It is further preferable that the PAS (A) manufactured as described above is further treated with acid and then washed with water, since it is possible to decrease the amount of residual metal ions, improve moisture resistance, and decrease the residual amount of low molecular weight impurity which is generated by a polymerization of PAS (A).

As the acid which can be usable for the treatment, acetic acid, hydrochloric acid, sulfuric acid, phosphoric acid, silicic acid, carbonic acid and propyl acid are preferably used, since they effectively reduce the amount of residual metal ions without decomposition of PAS (A). Among them, acetic acid and hydrochloric acid are more preferably used.

As the acid treatment, a method wherein PAS is immersed in acid or an aqueous acid solution is cited. In the treatment, stirring or heating may be performed if necessary.

Here, concrete examples of the acid treatment include a method using acetic acid wherein an aqueous acetic acid solution having pH 4 is heated at 80 to 90° C. at first, and PAS (A) is immersed in the solution for 20 to 40 minutes while stirring is performed.

PAS (A), which is treated with acid as described above, is subsequently washed with water or hot water for several times to physically remove residual acid, salt or the like. In the method, distilled water or deionized water is preferably used for washing.

It is preferable that PAS (A), which is subjected to the acid treatment, is a granular material. Concretely, the PAS (A) may have a granular material having a form such as a pellet form or a slurry-like form obtained after polymerization.

Examples of polyamide (B) used in the present invention include: aromatic polyamide and aliphatic polyamide such as polyamide 6 which is a ε-caprolactam polymer, polyamide 11 which is an undecane lactam polymer, polyamide 12 which is a lauryl lactam polymer, polyamide 46 which is a co-condensation material of tetramethylenediamine/adipic acid, polyamide 66 which is a co-condensation material of hexamethylenediamine/adipic acid, and polyamide 610 which is a co-condensation material of hexamethylenediamine/sebacic acid. Polyamide 46 and aromatic polyamide described below are preferably used, since compatibility with PAS (A) becomes well, heat resistance of a molded product becomes well, and especially, excellent heat resistance after re-flow can be achieved when they are used for a surface mount electronic component.

Concretely, aromatic polyamide used in the present invention includes a terephthalic acid amide structure represented by the following structure, as a unit included in repeating units.

Structural formula a

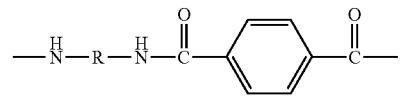

In the structural formula a, R represents an alkylene group having 2 to 12 carbon atoms. The aforementioned terephthalic acid amide structure is formed by reacting terephthalic acid or terephthalic acid dihalide and aliphatic diamine having 2 to 12 carbon atoms. Concrete examples of aliphatic diamine having 2 to 12 carbon atoms include: linear aliphatic alkylenediamine such as ethylene diamine, propane diamine, 1,4-butanediamine, 1,6-hexanediamine, 1,7-heptanediamine, 1,8-octanediamine, 1,9-nonanediamine, 1,10-decanediamine, 1,11-undecanediamine and 1,12-dodecanediamine; branched aliphatic alkylenediamine, such as 1-butyl-1,2-ethane diamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine, 2,3-dimethyl-1,4-butanediamine, 2-methyl-1,5-pentanediamine, 3-methyl-1,5-pentanediamine, 2,5-dimethyl-1,6-hexanediamine, 2,4-dimethyl-1,6-hexanediamine, 3,3-dimethyl-1,6-hexanediamine, 2,2-dimethyl-1,6-hexanediamine, 2,2,4-trimethyl-1,6-hexanediamine, 2,4,4-trimethyl-1,6-hexanediamine, 2,4-diethyl-1,6-hexanediamine, 2,2-dimethyl-1,7-heptanediamine, 2,3-dimethyl-1,7-heptanediamine, 2,4-dimethyl-1,7-heptanediamine, 2,5-dimethyl-1,7-heptanediamine, 2-methyl-1,8-octanediamine, 3-methyl-1,8-octanediamine, 4-methyl-1,8-octanediamine, 1,3-dimethyl-1,8-octanediamine, 1,4-dimethyl-1,8-octanediamine, 2,4-dimethyl-1,8-octanediamine, 3,4-dimethyl-1,8-octanediamine, 4,5-dimethyl-1,8-octanediamine, 2,2-dimethyl-1,8-octanediamine, 3,3-dimethyl-1,8-octanediamine, 4,4-dimethyl-1,8-octanediamine, 5-methyl-1,9-nonanediamine; and alicycle diamines such as cyclohexane diamine, methylcyclohexane diamine, isophorone diamine, norbornane dimethylamine and tricyclodecane dimethylamine.

Among them, linear aliphatic alkylenediamine having 4 to 8 carbon atoms and branched aliphatic alkylenediamine having 5 to 10 carbon atoms are preferable from the view point of moisture resistance and mechanical strength. Examples of preferable aromatic polyamide include: polyamide 6T which is obtained by polycondensation reaction wherein terephthalic acid is used as a main component of dicarboxylic acid and 1,6-hexanediamine is used as a main component of diamine; polyamide 6T which is obtained from a dicarboxylic acid component, wherein terephthalic acid is used as a main component, and a diamine component, wherein 1,6-hexanediamine is used as a main component; and polyamide 9T which is obtained from dicarboxylic acid component, wherein terephthalic acid is used as a main component, and a diamine component, wherein 1,9-nonane diamine and 2-methyl-1,8-octane diamine are used as main components.

It is preferable that the aromatic polyamide described above includes an isophthalic acid amide structure represented by the following structural formula b as well as the terephthalic acid structure, since it is possible to decrease a melting point of the aromatic polyamide itself and improve the compatibility with PAS (A).

Structural formula b

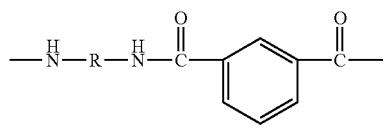

(In the Formulae, R is Equivalent to R of the Structural Formula a.)

Furthermore, the aromatic polyamide may include an acid amide structure represented by the following structural formula c as well as the terephthalic acid amide structure.

Structural formula c

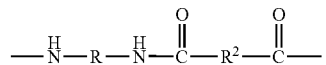

(In the formula, R is equivalent to R in the structural formula a, and $R^2$ represents an aliphatic hydrocarbon group having 4 to 10 carbon atoms.)

The acid amide structure represented by the structural formula c is formed by a reaction of aliphatic dicarboxylic acid having 4 to 10 carbon atoms, acid ester thereof, acid anhydride thereof or acid halide thereof, and aliphatic diamine having 2 to 12 carbon atoms. Concrete examples of the aliphatic dicarboxylic acid having 4 to 10 carbon atoms used in the reaction include: aliphatic dicarboxylic acid such as malonic acid, dimethylmalonic acid, succinic acid, glutaric acid, adipic acid, 2-methyl adipic acid, trimethyl adipic acid, pimelic acid, 2,2-dimethylglutaric acid, 3,3-diethyl succinic acid, azelaic acid, sebacic acid and suberic acid; and aliphatic dicarboxylic acids such as alicyclic dicarboxylic acid such as 1,3-cyclopentane dicarboxylic acid and 1,4-cyclohexane dicarboxylic acid.

Concrete examples of the acid ester of the aliphatic dicarboxylic acid having 4 to 10 carbon atoms described above include: methyl esters, ethyl esters, t-butyl ester and the like. Furthermore, examples of halogen atom which is used for structuring acid halide of the aliphatic dicarboxylic acid include bromine atom and chlorine atom.

As described above, the aromatic polyamide preferably includes the amide structure represented by the structural formula a, the structural formula b and/or the structural formula c, as structural parts. When an acid amid structure structured by one molecular of a dicarboxylic acid and one molecule of a diamine is provided as an one unit, it is preferable that 65 mol % or more of the terephthalic acid amide structure, 20 mol % or more of the isophthalic acid amide structure and 10 mol % or more of aliphatic hydrocarbon acid amide structure are included based on the total of acid amid structures which form the aromatic polyamide (B), from the viewpoint of superior effect of improving heat resistance. Furthermore, from the viewpoint of a balance between heat resistance and moisture resistance, it is preferable that the aromatic polyamide is a polyamide which is structured by 65 to 70 mol % of the terephthalic acid amide structure represented by the structural formula a, 20 to 25 mol % of the isophthalic acid amide structure represented by the structural formula b and 10 to 15 mol % of the acid amide structure represented by the structural formula c.

It is preferable that the aromatic polyamide has a melting point in a range of 290 to 330° C. and a glass transition temperature (Tg) in a range of 90 to 140° C., from the viewpoint of dispersibility of the polyamide into the PAS (A). Furthermore, regarding the molecular weight of a polyamide component used in the present invention, it is preferable that the peak molecular weight thereof obtained by the measurement using gel permeation chromatography is in a range of 30000 to 70000, and particularly preferable that the peak molecular weight thereof is in a range of 40000 to 60000. When the molecular weight of a polyamide component is in the range described above, release properties are particularly improved, when a polyarylene sulfide resin composition of the present invention is used for injection molding. Here, regarding conditions of gel permeation chromatography used in the present invention for measuring the molecular weight of a polyamide, the molecular weight can be obtained such that an eluant which is hexafluoroisopropanol containing 5 mM of sodium trifluoroacetate is prepared, a calibration curve of the molecular weight of polymethyl methacrylate having the clear molecular weight is obtained, and the molecular weight of a polyamide can be obtained as a converted value based on polymethyl methacrylate.

The aromatic polyamide can be manufactured by, for example, following methods (1) to (3).

(1) An interfacial polymerization, wherein an acid halide of a dicarboxylic acid component including terephthalic acid and a diamine component including aliphatic diamine having 2 to 12 carbon atoms are dissolved in two types of solvents, which are not compatible with each other, and then, the two liquids are mixed and stirred in the presence of alkali and quaternary ammonium salt, which is added in a catalyst quantity, to perform a polycondensation reaction.

(2) A solution polymerization, wherein an acid halide of a dicarboxylic acid component including terephthalic acid and a diamine component including aliphatic diamine having 2 to 12 carbon atoms are reacted in an organic solvent in the presence of an alkaline compound which receives acid such as tertiary amine.

(3) A melt polymerization, wherein an amide exchange reaction is carried out in a molten state using a diester of a dicarboxylic acid component including terephthalic acid and aromatic diamine as row materials.

Regarding a compounding ratio of PAS (A) to polyamide (B) in a polyarylene sulfide resin composition of the present invention, a mass ratio (A)/(B) which represents PAS (A)/polyamide (B) is preferably in a ratio of 95/5 to 50/50 from the viewpoint of superior low water absorption properties and superior heat resistance of a molded material. Furthermore, a range of 90/10 to 65/35 is more preferable, since superior flame retardance can be achieved as well as moisture resistance and heat resistance.

A polyarylene sulfide resin composition of the present invention can achieve remarkable decrease of a gas which is generated at the time of melting a composition comprising PAS (A) and polyamide (B), when a polyarylene sulfide resin composition of the present invention includes, in addition to the PAS (A) and the polyamide (B), an organic phosphorus compound (C) which is selected from the group consisting from an aromatic phosphite compound and an aromatic phosphonate compound, and an inorganic phosphorus compound (D) which is selected from the group consisting from a metal salt of phosphorous acid and a metal salt of hypophosphoric acid.

Examples of the aromatic phosphite compound which is included in the organic phosphorus compound (C) includes: tris-nonylphenyl phosphite, diphenylisodecyl phosphite, phenyldiisodecyl phosphite, 2,2-methylenebis(4,6-di-t-butylphenyl)octyl phosphite, 4,4'-butylidenebis(3-methyl-6-t-butylphenyl)ditridecyl phosphite, tris(2,4-di-t-butylphenyl) phosphite, tris(2-t-butyl-4-methylphenyl)phosphite, tris(2,4-di-t-amyl phenyl)phosphite, tris(2-t-butylphenyl)phosphite, tris[2-(1,1-dimethylpropyl)-phenyl]phosphite, tris[2,4-(1,1-dimethylpropyl)phenyl]phosphite, bis(2-t-butylphenyl)phenyl phosphite, tris(2-cyclohexyl phenyl)phosphite, tris(2-t-butyl-4-phenyl phenyl)phosphite, bis($C_{3\ to\ 9}$ alkylaryl) pentaerythritol diphosphite such as bis(2,4-di-t-butyl-4-methylphenyl)pentaerythritol diphosphite and bis(2,6-di-t-butyl-4-methylphenyl)pentaerythritol diphosphite, and bis (nonylphenyl)pentaerythritol diphosphite. On the other hand, as the aromatic phosphonate compound, tetrakis(2,4-di-t-butylphenyl)-4,4'-biphenylene phosphonate and the like.

Among the organic phosphorus compounds (C), a compound having a molecular weight of 600 or more is preferably used, since decomposition and vaporization thereof are small at the time of a melt-processing, and the reducing effect of the gas amount from the polyarylene sulfide resin composition is large. Particularly, from the view point of the excellent effect of reducing the amount of a generated gas, an aromatic phosphite compound is preferably used, and bis($C_{3\ to\ 9}$ alkylaryl) pentaerythritol diphosphite is more preferably used.

The mixing ratio of the organic phosphorus compound (C) is preferably in a range of 0.1 to 1 parts by mass based on 100 parts by mass which are the total of PAS (A), polyamide (B), an organic phosphorus compound (C) and an inorganic phosphorus compound (D), since the effect for preventing the gas generation at the time of melting is remarkable and the decomposition amount of the organic phosphorus compound (C) itself is small.

Examples of metal salt of phosphorous acid and metal salt of hypophosphoric acid which are included in the inorganic phosphorus compound (D) include salts of each of the alkali metals (the group I), salts of each of the alkaline-earth metals (the group II), salts of each of the groups III to V and salts of each of the transition metals.

Among them, salt of hypophosphoric acid is preferable from the view point of the reducing effect of a generated gas at the time of meting, and concrete examples thereof include sodium hypophosphate, calcium hypophosphate, aluminum hypophosphate, zinc hypo phosphate and the like.

A mixing ratio of the inorganic phosphorus compound (D) is preferably in a range of 0.1 to 1 parts by weight based on 100 parts by mass which are the total of PAS (A), polyamide (B), an organic phosphorus compounds (C) and an inorganic phosphorus compound (D), since the preventive effect of gas generation at the time of melting is remarkable and variation of flow properties at the time of melting becomes small.

In the present invention, it is preferable that an epoxy alkoxy silane compound (E) is used in combination, since dispersibility of the aromatic polyamide is extremely improved and the improving effect of heat resistance and flame retardance becomes remarkable.

The epoxy alkoxy silane compound (E) is a silane compound which has one or more epoxy groups and two or more alkoxy groups in a molecular. Here, examples of the alkoxy group include: an alkoxy group having 1 to 6 carbon atoms and a polyalkylene oxy group, which is structured with 2 to 6 units of alkoxyl groups as a repeating unit. Concrete examples of the epoxy alkoxy silane compound (E) include: γ-3-glycidoxypropyltrimethoxysilane, β-(3,4-epoxycyclohexyl)ethyltrimethoxysilane, and γ-glycidoxypropyltriethoxysilane.

The mixing amount of the epoxy alkoxy silane compound (E) is preferably 0.01 to 5 parts by mass based on 100 parts by mass, which are the total of the PAS (A) and the aromatic polyamide, and more preferably 0.1 to 2 parts by mass.

The polyarylene sulfide resin composition of the present invention preferably includes a hydrotalcite compound (F) in addition to each aforementioned compound, since it is possible to obtain superior effects of improving appearance of a molded material obtained after thermal treatment, to prevent thermal decomposition of polymer components when melt-kneading of the PAS (A) and the aromatic polyamide is performed or when thermal treatment of a molded material is performed in a reflow furnace, and to furthermore improve flame retardance and mechanical strength.

The hydrotalcite compound (F) used in the present invention is an inorganic compound, wherein hydroxide of a bivalent metal ion and a trivalent metal ion is included as a laminar crystalline structure, and anion is furthermore included between layers of the laminar crystalline structure, or a sintered substance of the inorganic compound.

Examples of the bivalent metal ion which is included in the hydrotalcite compound (F) include $Mg^{2+}$, $Mn^{2+}$, $Fe^{2+}$, $Co^{2+}$, $Ni^{2+}$, $Cu^{2+}$ and $Zn^{2+}$, and examples of the trivalent metal ion include $Al^{3+}$, $Fe^{3+}$, $Cr^{3+}$, $Co^{3+}$ and $In^{3+}$. Examples of the anion include $OH^-$, $F^-$, $Cl^-$, $Br^-$, $NO_3^-$, $CO_3^-$, $SO_4^{2-}$, $Fe(CN)_6^{3-}$ and $CH_3COO^-$, a molybdic acid ion, a polymolybdic acid ion, a vanadic acid ion and a polyvanadic acid ion.

Among them, it is preferable that the trivalent metal ion is $Al^{3+}$, and the anion is $CO_3^-$ from the view point of the excellent ion exchange ability with respect to an acid component originating from PAS (A) and the superior effects of preventing gas generation. Concretely, for example, a compound represented by the following formula is preferably used.

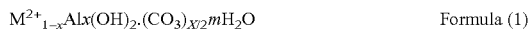

$$M^{2+}{}_{1-x}Al_x(OH)_2 \cdot (CO_3)_{x/2} mH_2O \qquad \text{Formula (1)}$$

(In the formula (1), $M^{2+}$ represents a bivalent metal ion selected from Mg, Ca and Zn, and x and m are values which satisfy $0<x<0.5$, and $0\leq m\leq 2$.)

Examples of a compound which satisfies the above formula (1) include: $Mg_{0.7}Al_{0.3}(OH)_2(CO_3)_{0.15} \cdot 0.54H_2O$, $Mg_{4.5}Al_2(OH)_{13}CO_3 \cdot 3.5H_2O$, $Mg_{4.3}Al_2(OH)_{12.6}CO_3 \cdot 3.5H_2O$, $Mg_{4.2}Al_2(OH)_{12.4}CO_3$, $Zn_6Al_2(OH)_{16}CO_3 \cdot 4H_2O$, $Ca_6Al_2(OH)_{16}CO_3 \cdot 4H_2O$ and the like, in addition to natural hydrotalcite represented by $Mg^{2+}{}_6Al_2(OH)_{16} \cdot (CO_3) \cdot 4H_2O$. Among them, a Mg—Al type hydrotalcite-like compound represented by the following formula (2) is particularly preferable in the present invention, from the viewpoint of preventing the gas generation.

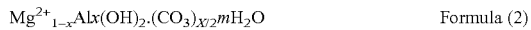

$$Mg^{2+}{}_{1-x}Al_x(OH)_2 \cdot (CO_3)_{x/2} mH_2O \qquad \text{Formula (2)}$$

(In the formula (2), x and m are values which satisfy $0<x<0.5$, and $0\leq m\leq 2$.)

The mixing amount of the hydrotalcite compound (F) in the polyarylene sulfide resin composition of the present invention is preferably in the range of 0.1 to 1.0% by mass, or the mixing amount of the hydrotalcite compound (F) is in the range of 0.01 to 5 parts by mass based on 100 parts by mass, which are the total mass of the PAS (A) and the aromatic polyamide, and is more preferably in the range of 0.1 to 2 parts by mass, from the view point of an excellent preventive effect of gas generation.

In the present invention, a fibrous reinforcing material (G-1) or an inorganic filler (G-2) is preferably added in addition to the aforementioned each component, from the view point of mechanical strength of a molded material.

Examples of the fibrous reinforcing material (G-1) include: inorganic fibrous materials such as glass fiber, carbon fiber such as PAN type or pitch type, silica fiber, silica alumina fiber, zirconia fiber, boron nitride fiber, silicon nitride fiber, boron fiber, aluminum borate fiber, potassium titanate fiber, metal fiber-like material of stainless steel, aluminum, titanium, copper, brass and the like; and organic fibrous materials such as aramid fiber and the like.

Examples of the inorganic filler (G-2) include: silicate such as mica, talc, wollastonite, sericite, kaolin, clay, bentonite, asbestos, alumina silicate, zeolite, and pyrophyllite; carbonate such as calcium carbonate, magnesium carbonate and dolomite; sulfate such as calcium sulfate and barium sulfate; metal oxide such as alumina, magnesium oxide, silica, zirconia, titania and iron oxide; and glass beads, ceramic beads, boron nitride, silicon carbide, calcium phosphate and the like. These fibrous reinforcing materials (G-1) and the inorganic fillers (G-2) may be used singly or in combination of two or more.

The mixing amount of the fibrous reinforcing material (G-1) or the inorganic filler (G-2) is preferably in a range of 1 to 200 parts by weight based on 100 parts by mass which is the total of the PAS (A) and the aromatic polyamide (B). The fibrous reinforcing material (G-1) and the inorganic filler (G-2) may be surface-treated with a surface treatment agent such as a silane coupling agent or a titanium coupling agent, in so far as the performance of a molded product obtained from the polyarylene sulfide resin composition of the present invention is not prevented.

Furthermore, it is preferable that the polyarylene sulfide resin composition of the present invention also includes an antioxidant or a stabilizer (H) in so far as the effects of the present invention are not prevented, since it is possible to achieve superior effects of improving appearance of a molded material after thermal treatment, and to prevent thermal decomposition of polymer components when melt-kneading for the PAS (A) and the aromatic polyamide is performed or when thermal treatment of a molded material in a reflow furnace is performed, and flame retardance and mechanical strength can be further improved. Examples of the antioxidant or stabilizer include: antioxidants or a stabilizer including phenol (hindered phenols or the like), antioxidants or a stabilizer including amine (hindered amines or the like), antioxidants or a stabilizer including phosphorus, antioxidants or a stabilizer including sulfur, antioxidants or a stabilizer of hydroquinone type and antioxidants or a stabilizer of quinolines type.

An antioxidant or a stabilizer can be included in order to stably maintain heat resistance for a long period of time. Examples of the antioxidant or a stabilizer include: antioxidant or a stabilizer including phenol (hindered phenols or the like), antioxidant or a stabilizer including amine (hindered amine or the like), antioxidant or a stabilizer including phosphorus, antioxidant or a stabilizer including sulfur, and antioxidant or a stabilizer of hydroquinone type and quinolines type.

Examples of the phenol type antioxidants include hindered phenols such as 2,2'-methylenebis(4-methyl-6-t-butylphenol), 4,4'-methylenebis(2,6-di-t-butylphenol), 4,4'-butylidenebis(3-methyl-6-t-butylphenol) 2,6-di-t-butyl-p-cresol, 1,3,5-trimethyl-2,4,6-tris(3,5-di-t-butyl-4-hydroxybenzyl)benzene, 1,6-hexanediol-bis[3-(3,5-di-t-butyl-4-hydroxyphenyl)propionate], pentaerythritol tetrakis[3-(3,5-di-t-butyl-4-hydroxyphenyl)propionate], triethylene glycol-bis[3-(3-t-butyl-5-methyl-4-hydroxyphenyl)propionate], n-octadecyl-3-(4',5'-di-t-butylphenol)propionate, n-octadecyl-3-(4'-hydroxy-3',5'-di-t-butylphenol)propionate, stearyl-2-(3,5-di-t-butyl-4-hydroxyphenol)propionate, distearyl-3,5-di-t-butyl-4-hydroxybenzylphosphonate, 2-t-butyl-6-(3-t-butyl-5-methyl-2-hydroxybenzyl)-4-methylphenylacrylate, N,N'-hexamethylene bis(3,5-di-t-butyl-4-hydroxy-hydrocinnamamide), 3,9-bis{2-[3-(3-t-butyl-4-hydroxy-5-methylphenyl)propionyloxy]-1,1-dimethylethyl}-2,4,8,10-tetraoxaspiro[5,5]undecane, and 4,4'-thiobis(3-methyl-6-t-butylphenol) and 1,1,3-tris(2-methyl-4-hydroxy-5-t-butylphenol)butane.

Among the hindered phenols, examples of preferable hindered phenols include: $C_{2\ to\ 10}$ alkylene diol-bis[3-(3,5-di-t-branched $C_{3\ to\ 6}$ alkyl-4-hydroxyphenyl)propionate] such as 1,6-hexanediol-bis[3-(3,5-di-t-butyl-4-hydroxyphenyl)propionate]; dioxy or trioxy $C_{2\ to\ 4}$ alkylene diol-bis[3-(3,5-di-branched $C_{3\ to\ 6}$ alkyl-4-hydroxyphenyl) propionate] such as triethylene glycol-bis[3-(3-t-butyl-5-methyl-4-hydroxyphenyl)propionate]; $C_{3\ to\ 8}$ alkylene triol-bis[3-(3,5-di-branched $C_{3\ to\ 6}$ alkyl-4-hydroxyphenyl) propionate] such as glycerin tris[3-(3,5-di-t-butyl-4-hydroxyphenyl)propionate]; and $C_{4\ to\ C8}$ alkylenetetraol tetrakis[3-(3,5-di-branched $C_{3\ to\ 6}$ alkyl-4-hydroxyphenyl)propionate] such as pentaerythritol tetrakis[3-(3,5-di-t-butyl-4-hydroxyphenyl)propionate].

Examples of the amine including antioxidant includes hindered amines, such as a tri- or tetra $C_{1\text{ to }3}$ alkylpiperidine or a derivative thereof [e.g., 4-methoxy-2,2,6,6-tetramethylpiperidine, 4-benzoyloxy-2,2,6,6-tetramethylpiperidine, 4-phenoxy-2,2,6,6-tetramethylpiperidine], a bis(tri-, tetra- or penta $C_{1\text{ to }3}$ alkylpiperidine), $C_{2\text{ to }20}$ alkanedicarboxylic acid ester [e.g., bis(2,2,6,6-tetramethyl-4-piperidyl)oxalate, bis(2,2,6,6-tetramethyl-4-piperidyl)malonate, bis(2,2,6,6-tetramethyl-4-piperidyl) adipate, bis(2,2,6,6-tetramethyl-4-piperidyl)sebacate, bis(1,2,2,6,6-pentamethyl-4-piperidyl) sebacate, and bis(2,2,6,6-tetramethyl-4-piperidyl) terephthalate], 1,2-bis(2,2,6,6-tetramethyl-4-piperidyloxy) ethane, phenyl-1-naphthylamine, phenyl-2-naphthylamine, N,N'-diphenyl-1,4-phenylenediamine, and N-phenyl-N'-cyclohexyl-1,4-phenylenediamine.

Examples of the phosphorus including stabilizer (or a antioxidants) include: triisodecyl phosphite, trisnonylphenyl phosphite, diphenyl isodecyl phosphate, phenyl diisodecyl phosphate, 2,2'-methylene bis(4,6-di-t-butylphenyl)octyl phosphite, 4,4'-butylidene bis(3-methyl-6-t-butylphenyl)ditridecylphosphite, tris(branched $C_{3\text{ to }6}$ alkylphenyl) phosphate (e.g., tris(2,4-di-t-butylphenyl)phosphate, tris(2-t-butyl-4-methylphenyl)phosphate, tris(2,4-di-t-amylphenyl) phosphate, tris(2-t-butylphenyl)phosphate, tris[2-(1,1-dimethylpropyl)-phenyl]phosphate, tris(2,4-(1,1-dimethylpropyl)-phenyl]phosphate and the like), bis(2-di-t-butylphenyl)phenyl phosphate, tris(2-cyclohexylphenyl) phosphate, tris(2-t-butyl-4-phenylphenyl) phosphate, bis ($C_{3\text{ to }6}$ alkylaryl)pentaerythritol diphosphite (e.g., bis(2,4-di-t-butyl-4-methylphenyl)pentaerythritol diphosphite, bis(2,6-di-t-butyl-4-methylphenyl)pentaerythritol diphosphite, bis (nonylphenyl)pentaerythritol diphosphite, and bis (nonylphenyl)pentaerythritol diphosphite), triphenylphosphite type stabilizer (e.g., 4-phenoxy-9-α-(4-hydroxyphenyl)-p-cumenyloxy-3,5,8,10-tetraoxa-4,9-diphosphaspiro[5.5]undecane), and tris(2,4-di-t-butylphenyl)phosphate), a diphosphonite type stabilizer (e.g., tetrakis (2,4-di-t-butyl)-4,4'-biphenylene diphosphonite) and the like. The phosphorus including a stabilizer has a branched $C_{3\text{ to }6}$ alkylphenyl group (particularly, t-butylphenyl group) in general.

Examples of the hydroquinone-type antioxidant includes 2,5-di-t-butylhydroquinone and the like, examples of the quinoline-type antioxidant includes 6-ethoxy-2,2,4-trimethyl-1,2-dihydroquinone and the like, and examples of the sulfur including antioxidant include dilaurylthiodipropionate, distearylthiodiproionate and the like.

These antioxidants and the stabilizers may be used singly or in combination of two or more. From the view point of excellent preventive effects of gas generation, the mixing amount of the antioxidant or the stabilizer (H) is preferably in a range of 0.1 to 1.0% by mass based on the polyarylene sulfide resin composition of the present invention, or is preferably in a range of 0.01 to 5 parts by mass and more preferably 0.01 to 2 parts by mass based on the 100 parts by mass which are the total of the PAS (A) and the aromatic polyamide.

Furthermore, it is preferable that the polyarylene sulfide resin composition of the present invention is blended so that the chlorine atom content of the heat resisting resin composition is 900 ppm or less from the viewpoint of control of the chlorine atom content. Here, the chlorine atom content of the heat resisting resin composition means the chlorine atom content wherein the chlorine atom exists not only in resin components but also in all blended components. The quantitative determination of a chlorine atom can be performed such that a gas generated by combustion treatment of a sample in a sealed quartz tube (900° C., Ar—$O_2$ atmosphere) is allowed to be absorbed to pure water, and then ion chromatography is carried out using the water to measure chloride ions.

The polyarylene sulfide resin composition of the present invention can include a suitable amount of a processing heat stabilizer, a plasticizer, a mold releasing agent, a coloring agent, lubricant, a weathering agent, a foaming agent, a rust preventing agent, wax, a crystalline nucleus agent and the like, in so far as the effects of the present invention are not prevented.

The polyarylene sulfide resin composition of the present invention can optionally include the other resin components in accordance with required properties. Examples of the resin components which can be used as the other resin composition include: homopolymers or copolymers of monomers such as ethylene, butylene, pentene, isoprene, chloroprene, styrene, α-methylstyrene, vinylacetate, vinylchloride, acrylate, methacrylate, and (meth)acrylonitrile; and homopolymers, random copolymer, block copolymer and graft copolymer such as polyurethane, polyesters such as polyester, polybutylene terephthalate and polyethylene terephthalate, polyacetal, polycarbonate, polysulfone, polyallylsulfone, polyethersulfone, polyphenyleneether, polyetherketone, polyetheretherketone, polyimide, polyamideimide, polyetherimide, a silicone resin, an epoxy resin, a phenoxy resin, a liquid crystal polymer, and polyarylether.

The recrystallization peak temperature of the PAS (A) which is included in the polyarylene sulfide resin composition is preferably 220° C. or more, more preferably in the range of 220 to 240° C. and still more preferably 222 to 235° C., when differential scanning calorimetry (DSC) of the polyarylene sulfide resin composition of the present invention is measured. When the recrystallization peak temperature of the PAS (A) included in the polyarylene sulfide resin composition is in the above range, compatibility thereof with the polyamide (B) becomes well and blister resistant can be improved.

On the other hand, the recrystallization peak temperature of the polyamide (B) included in the polyarylene sulfide resin composition is preferably 265° C. or less, more preferably in the range of 240 to 265° C. and still more preferably 255 to 262° C. When the recrystallization peak temperature of the polyamide (B) is in the above range, the compatibility thereof with the PAS (A) improves and blister resistance can be improved.

It is preferable for the polyarylene sulfide resin composition of the present invention that the mixing ratio of the polyamide (B) in the resin composition is 8 to 20% by mass, and the extraction ratio thereof is 7% by mass or less when extraction is performed for the resin composition with hexafluoroisopropanol at 70° C. for 15 minutes. Here, polyamide can dissolve in hexafluoroisopropanol, and the result wherein the amount of the polyamide measured by the extraction using hexafluoroisopropanol is smaller than the mixing ratio of the polyamide in the polyarylene sulfide resin composition suggests that a form, which is not easily dissolved in hexafluoroisopropanol as compared with polyamide, is formed in the resin composition, and it is supposed that suitable polymer alloy of PAS/polyamide is generated, and therefore the heat resistance thereof can be improved. Particularly, it is preferable that a value of Y/X is in a range of 0.01 to 0.40, when X (mass %) represents the mixing amount of the polyamide (B) in the polyarylene sulfide resin composition of the present invention and Y (mass %) represents an extraction ratio at the time of performing extraction with hexafluoroisopropanol at 70° C. for 15 minutes for the composition. The extraction method for obtaining an extraction ratio is described in Examples.

Concrete examples of the production method of the aforementioned polyarylene sulfide resin composition include a method wherein the PAS (A), the polyamide (B) and the other components, which are mixed if necessary, are uniformly mixed by a tumbler or a Henschel mixer, the mixture is provided in a double-screw extruder to perform melt-kneading under the condition that a ratio of a discharge amount (kg/hr) of the resin component to a screw rotation rate (rpm) (discharge amount/screw rotation rate) is 0.02 to 0.2 (kg/hr·rpm). When the resin composition is produced under such a condition, it enables to control the average volume diameter of the aromatic polyamide, wherein the PAS (A) is microdispersed as a matrix, to 0.1 to 1.0 µm.

As an example of the production method described above, a method can be explained in detail wherein the aforementioned components are provided in the double-screw extruder, and melt kneading is performed under the temperature condition of the setting temperature of about 330° C. and the resin temperature of 350° C. At this time, the discharge amount of the resin composition is in a range of 5 to 50 kg/hr at a screw rotation rate of 250 rpm. The discharge amount of 20 to 35 kg/hr is particularly preferable from the viewpoint of dispersibility. Accordingly, the ratio of a discharge amount (kg/hr) of the resin component to a screw rotation rate (rpm) (discharge amount/screw rotation rate) is particularly preferably 0.08 to 0.14 (kg/hr·rpm).

Among the mixing components, it is preferable that the fibrous reinforcing material (G-1) is provided into the double-screw extruder from a side feeder of the double-screw extruder from the view point of superior dispersibility of the fibrous reinforcing material (G-1). The side feeder is preferably positioned such that a ratio of the length from an input opening of the extruder used for adding a resin to the side feeder to the total length of the double-screw extruder is 0.1 to 0.6, and more preferably 0.2 to 0.4.

The polyarylene sulfide resin composition melt-kneaded as described above is obtained as pellets, and the pellets are subsequently provided to a molding machine to perform melt-molding, and thereby a target molded product can be obtained.

Examples of the melt-kneading method include: injection molding, extrusion molding, compression molding and the like. Among them, as a molding of a surface mount electronic component, injection molding is particularly preferable.

The molded product obtained as described above is excellent in heat resistance and has high elastic coefficient at a high temperature range. Therefore, it is preferably used as a molded product which is subjected to soldering. In particular, as described above, a surface temperature of a board in a heating furnace (reflow furnace) increases to a high temperature of 280° C. or more when an electronic component is used for a surface mounting, and therefore, melting or deformation tends to be caused when conventional PAS is used for the component. On the other hand, a molded product can be soldered to a board without causing melting or deformation, when the polyarylene sulfide resin composition of the present invention is used. The aforementioned surface temperature of a board to which soldering is carried out, means the temperature of the surface of a board, to which the soldering step is actually performed in the surface mounting method and the temperature thereof is actually measured. Concrete examples of the board include a circuit board, a printed wiring board used in SMT method and the like.

Examples of the heating method performed in a heating furnace (reflow furnace) in the surface mount method include: (1) a thermal conduction method wherein a board is heated while loading on a heat-resistant belt which moves on a heater, (2) a vapor phase soldering (VPS) method wherein latent heat generated at the time of aggregation of fluorine-based liquid having a boiling point of about 220° C. is used, (3) a hot-air convection thermal transfer method wherein a board is passed through a space where hot air is forcedly circulated, (4) an infrared ray method wherein heating of a board is performed from the upper side or the upper and lower sides of the board by infrared rays, and (5) a method wherein hot-air heating and infrared-ray heating are combined.

The molded product of the polyarylene sulfide resin composition of the present invention can be used in various fields such as precision components, various types of electro components and electronic components, mechanical components, automotive parts, architecture, sanitary, sports, general merchandise and the like. The molded product can be particularly useful as a surface mount electronic component as described above, since the molded product is excellent in flame retardancy, heat resistance, rigidity and the like.

The surface mount electronic component of the present invention includes a molded product of the polyarylene sulfide resin composition of the present invention and a metal terminal as essential components. The surface mount electronic component is fixed on a printed wiring board or a circuit board by the surface mounting method. When the electronic component is fixed on such a board by the surface mounting method, the metal terminal of the electronic component is provided on the surface of the board so as to be connected to a conducting part of the board via a soldering ball, and the component is heated in a reflow furnace by the aforementioned heating method so that the electronic component is soldered to the board.

Concrete examples of the electronic component used for surface mounting include: a connector, a switch, a sensor, a resistor, a relay, a capacitor, a socket, a jack, a fuse holder, a coil bobbin, a housing of an IC or an LED and the like, which can correspond to the surface mounting method.

The polyarylene sulfide resin composition obtained by the manufacturing method of the present invention can achieve high flame retardancy, which can correspond V-0 in UL flame resistance test standard UL-94 (Underwriters Laboratories Inc. (UL) standard No. 94), even if a flame retarder such as so-called halogen-based copper, antimony oxide and metallic hydroxide is not used.

EXAMPLES

Hereinafter, the present invention is explained in detail using examples.

Examples 1 to 6 and Comparative Examples 1 to 5

Polyarylene sulfide, aromatic polyamide and other compounding materials (except for glass fiber chopped strand) were uniformly mixed in a tumbler in accordance with a mixing ratio described in Table 1. Then, the mixed materials were provided in a double-screw extruder, to which a vent was provided, "TEM-35B" (manufactured by Toshiba Machine Co., Ltd.), and while glass fiber chopped strand having a fiber diameter of 10 µm and a length of 3 mm was supplied from a side feeder (a ratio of a distance from the resin supplied portion to the side feeder to the total length of the screw is 0.28) so that 40 parts by mass of the strand was supplied with respect to 60 parts by mass of the aforementioned mixed materials, melt kneading was performed at a discharge amount of resin components of 25 kg/hr, a screw rotation rate of 250 rpm, a ratio of the discharge amount of resin components (kg/hr) to the screw rotation rate (rpm) (discharge amount of resin components/screw rotation rate) of 0.1 (kg/hr·rpm) and a setting resin temperature of 330° C., to obtain a pellet of the resin composition.

Subsequently, the following evaluation tests were performed using the pellet.

[Measurement of an Amount of Generated Gas]

An amount of a gas, which was generated at a temperature of 330° C. for 15 minutes, was determined by a gas chromatography GC2010 (detector: mass spectrometer QP2010) manufactured by Shimadzu corporation, which was equipped with Double-Shot Pyrolyzer manufactured by Frontier Laboratories Ltd., using monochlorobenzene as a standard reference material.

[Blister Resistance Test]

The pellet of the resin composition was molded using an injection molding machine to obtain a box-like connector having a vertical length of 50 mm, a horizontal length of 10 mm, a height of 8 mm and a thickness of 0.8 mm.

(Evaluation of Blister after Drying)

A reflow step was performed for the box-like connector in accordance with temperature profile shown in FIG. 1 using an infrared heating furnace (manufactured by Sanyoseiko Co., Ltd.: SMT Scope). Evaluation was performed based on the following two steps standard by observing the box-like container after heating.

A: Appearance was not changed.
B: Blister or melting was observed.

(Evaluation of Blister after Humidification)

After humidification was performed for an injection molded product at an atmosphere of 23° C., 60% RH and 24 hours, the appearance thereof was observed by a reflow simulator.

A: No blister was generated.
B: Small amounts of small blisters were generated.
C: Large amount of blisters were generated.

[Burning Test]

Burning test was performed in accordance with a UL-94 vertical test to evaluate flame retardance.

[Measurement of Chlorine Atom Content]

Burning treatment (900° C., Ar—$O_2$ atmosphere) was performed for the pellet of the resin composition in a sealed quartz tube, a generated gas was absorbed in pure water and the amount of a chloride ion was determined by ion chromatography to obtain the chlorine atom content.

(Treatment Device)

Burned gas absorbing device: "AQF-100" manufactured by DIA Instruments Co., Ltd.

Ion chromatography: "ICS-3000" manufactured by Dionex Corporation

[Measurement of a Recrystallization Peak Temperature (Tc2)]

At first, a sample was heated at a temperature (330° C.) which was equal to or more than a melting temperature of polyarylene sulfide (A) and aromatic polyamide (B) (temperature rising ratio: 20° C./min), the sample was maintained at the melted state (maintained time: 3 minutes), the sample was cooled at 120° C. at a temperature decreasing ratio of 20° C./min, and the indicated recrystallization peak temperature (Tc2) was measured.

[Evaluation of an Extraction Ratio by Hexafluoroisopropanol]

Freezing pulverization of the pellet of the resin composition was performed using a freezing pulverizing machine. Then, after removing coarse grains by passing through a mesh having an opening of 500 μm, the weight of about 1 g of the sample obtained by the freezing pulverization was measured correctly, and was provided in a 20 ml sample tube. 4 ml of hexafluoroisopropanol (hereinafter, abbreviated to "HFIP") was added to the sample. Next, supersonic treatment was performed to the sample tube to which the sample and HFIP were provided at a temperature of 70° C. for 15 minutes. Furthermore, the solution obtained after the supersonic treatment was filtrated with a filter, wherein the mass thereof was correctly measured. Subsequently, the sample was dried with the filter, and the weight thereof was measured to obtain the mass of the sample which was not absorbed in HFIP. The difference between the mass of the sample, which was measured before the supersonic treatment performed with HFIP, and the mass of the sample which was remained on the filter after the supersonic treatment (the mass of the filter was not included) represents the mass of the sample extracted by HFIP. An extraction ratio was obtained by dividing the mass of the sample extracted by HFIP by the mass of the sample which was measured before the supersonic treatment is performed in HFIP, and is shown by percentage.

[Evaluation of Release Properties]

Using the pellet of the resin composition, release properties at the time of injection molding was evaluated with a mold having a cavity shown in FIG. 2. Molding conditions were a resin temperature of 340° C. and a mold temperature of 130° C. By gradually decreasing cooling time provided after completion of filling, time at which a molded product cannot be ejected from a mold was determined. Evaluation was performed based on the shortest time T1 required for ejecting a molded product from a mold as follows.

A: Ti is 10 seconds or less
B: T1 is 10 to 15 seconds
C: T1 is 15 seconds or more Furthermore, regarding a resin composition which had T1 of 10 seconds or less, release properties were evaluated using the pellet by performing injection molding with a mold which has a connector-like cavity having a vertical length of 25 mm, a horizontal length of 2 mm, a thickness of 0.3 to 0.5 mm and 45 Pin-0.2 mm pitch. Molding conditions were a resin temperature of 340° C. and a mold temperature of 140° C. By gradually decreasing cooling time provided after completion of filling, time at which a molded product cannot be ejected from a mold was determined. Release properties were evaluated such that "AA" is provided when the shortest time T2 which is required for ejecting a molded product from a mold is 3 seconds or less.

Here, compounded resins and materials shown in Table 1 are as follows.

(1) PPS-1: polyphenylene sulfide ("DSR LR-1G" manufactured by DIC corporation, non-Newtonian index of 1.1, peak molecular weight of 28000, and Mw/Mn=7.5)

(2) PA6T-1: aromatic polyamide (melting point of 310° C., Tg of 120° C. and peak molecular weight of 45800), which is obtained by reacting, as essential monomer components, 65 mol % of terephthalic acid, 25 mol % of isophthalic acid and 10 mol % of adipic acid (3) PA6T-2: aromatic polyamide (melting point of 310° C., Tg of 120° C. and peak molecular weight of 36100), which is obtained by, as reacting essential monomer components, 64 mol % of terephthalic acid, 34 mol % of isophthalic acid and 2 mol % of adipic acid (4) PA9T: polyamide 9T ("Genestar N1000A" manufactured by Kuraray Co., Ltd.)

(5) PA46: polyamide 46 ("Stanyl TS300" manufactured by DSM Japan Engineering Plastics Corporation)

(6) Si: epoxysilane (γ-glycidoxy propyl methoxysilane)
(7) Phosphite: a phosphorus type processing heat stabilizer ("Adk Stab PEP-36" manufactured by Adeka Corporation, bis(2,6-di-t-butyl-4-methylphenyl)pentaerythritol diphosphite)
(8) Phosphonite: a phosphorus type processing heat stabilizer ("Hostanox P-EPQ" manufactured by Clariant Japan Corporation, tetrakis(2,4-di-t-butylphenyl)-4,4'-biphenylene phosphonate)
(9) Hypophosphorous acid Ca: Calcium hypophosphite
(10) Antioxidant: Hindered phenol type antioxidant ("Irganox 1098" manufactured by Chiba Specialty Chemicals Inc.)
(11) Hydrotalcite ("DHT-4A" manufactured by Kyowa Chemical industry Co., Ltd.)
(12) GF: Glass fiber chopped strand (fiber diameter of 10 μm and fiber length of 3 mm)

TABLE 1

| | | Examples | | | | | |
|---|---|---|---|---|---|---|---|
| | | 1 | 2 | 3 | 4 | 5 | 6 |
| Mixing composition (parts by weight) | PPS-1 | 40.3 | 40.3 | 39.6 | 41.0 | 40.3 | 40.3 |
| | PA6T-1 | 17.2 | | 16.9 | 17.6 | | |
| | PA6T-2 | | 17.2 | | | | |
| | PA9T | | | | | 17.2 | |
| | PA46 | | | | | | 17.2 |
| | Si | 0.5 | 0.5 | 0.5 | | 0.5 | 0.5 |
| | Phosphite | 0.5 | 0.5 | 1.0 | | 0.5 | 0.5 |
| | Phosphonite | | | | 0.2 | | |
| | Hypophosphorous acid Ca | 0.5 | 0.5 | 0.5 | 0.2 | 0.5 | 0.5 |
| | Antioxidant | 0.5 | 0.5 | 1.0 | 0.5 | 0.5 | 0.5 |
| | Hydrotalcite | 0.5 | 0.5 | 0.5 | 0.5 | 0.5 | 0.5 |
| | GF | 40.0 | 40.0 | 40.0 | 40.0 | 40.0 | 40.0 |
| Amount of generated gas (% by mass) | | 0.15 | 0.18 | 0.18 | 0.21 | 0.20 | 0.26 |
| Blister evaluation | After drying | A | A | A | A | A | A |
| | After humidification | A | A | A | A | A | A |
| Flame retardance | | V-0 | V-0 | V-0 | V-0 | V-0 | V-0 |
| Chlorine atom content (ppm) | | 610 | 610 | 600 | 610 | 610 | 610 |
| Recrystallization peak temperature (°C.) of PPS component | | 223 | 225 | 224 | 224 | 225 | 224 |
| Recrystallization peak temperature (°C.) of polyamide component | | 259 | 271 | 257 | 258 | 234 | 222 |
| Extraction ratio (Y) of HFIP (mass %) | | 4.2 | 3.2 | 4.3 | 4.3 | 3.5 | 4.8 |
| Extraction ratio (Y) of HFIP/mixing ratio of PA (X) | | 0.24 | 0.19 | 0.25 | 0.24 | 0.20 | 0.28 |
| Release property | | AA | A | AA | AA | A | A |

TABLE 2

| | | Comparative Examples | | | | |
|---|---|---|---|---|---|---|
| | | 1 | 2 | 3 | 4 | 5 |
| Mixing composition (parts by weight) | PPS-1 | 41.0 | 40.3 | 40.3 | 59.5 | |
| | PA6T-1 | 17.5 | | | | 59.1 |
| | PA6T-2 | | 17.2 | 17.2 | | |
| | PA9T | | | | | |
| | PA46 | | | | | |
| | Si | 0.5 | 0.5 | 0.5 | 0.5 | 0.5 |
| | Phosphite | | 1.0 | | | 0.2 |
| | Phosphonite | | | | | |
| | Hypophosphorous acid Ca | | | 1.0 | | 0.2 |
| | Antioxidant | 0.5 | 0.5 | 0.5 | | |
| | Hydrotalcite | 0.5 | 0.5 | 0.5 | | |
| | GF | 40.0 | 40.0 | 40.0 | 40.0 | 40.0 |
| Amount of generated gas (% by mass) | | 0.48 | 0.38 | 0.35 | 0.15 | 0.32 |
| Blister evaluation | After drying | A | A | A | B | B |
| | After humidification | C | B | B | B | C |
| Flame retardance | | V-0 | V-0 | V-0 | V-0 | HB |
| Chlorine atom content (ppm) | | 610 | 610 | 610 | 900 | 10 |
| Recrystallization peak temperature (°C.) of PPS component | | 222 | 224 | 224 | 218 | — |
| Recrystallization peak temperature (°C.) of polyamide component | | 261 | 273 | 273 | — | 263 |
| Extraction ratio (Y) of HFIP (mass %) | | 5.1 | 3.5 | 3.6 | 0.1 | 55.5 |
| Extraction ratio (Y) of HFIP/mixing ratio of PA (X) | | 0.29 | 0.20 | 0.21 | — | 0.94 |
| Release property | | A | A | A | AA | AA |

Figure 1:
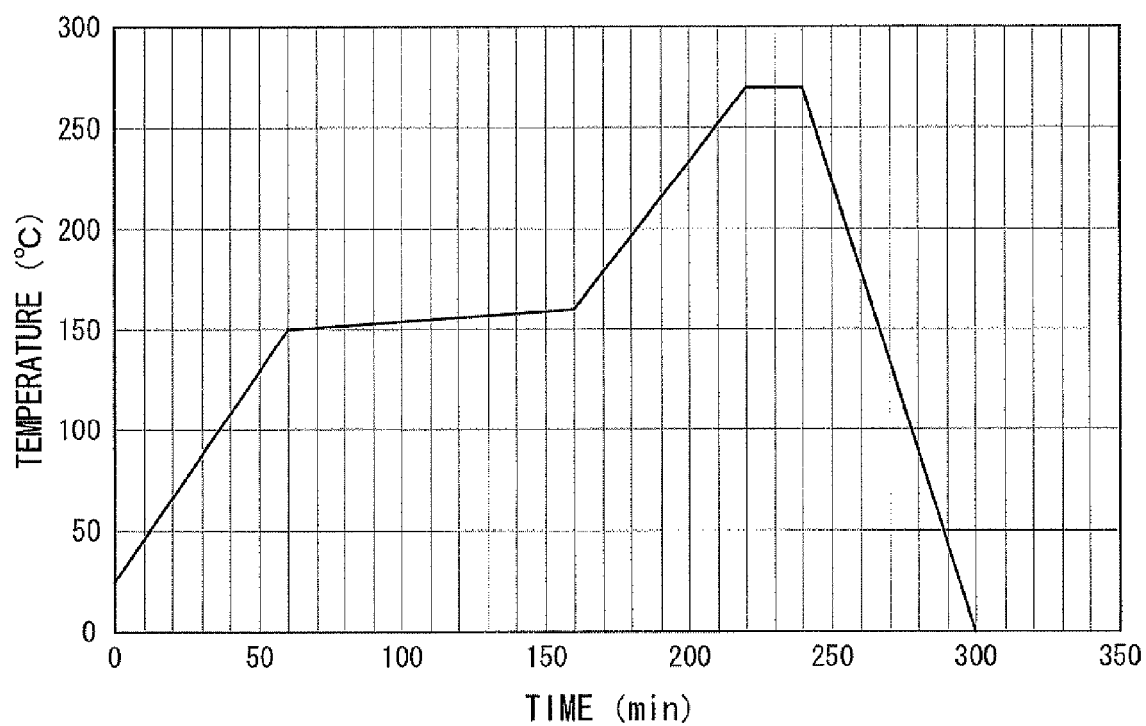
FIG. 1 is a graph which shows a temperature profile in an infrared heating furnace in a blister resistance test.
Figure 2:
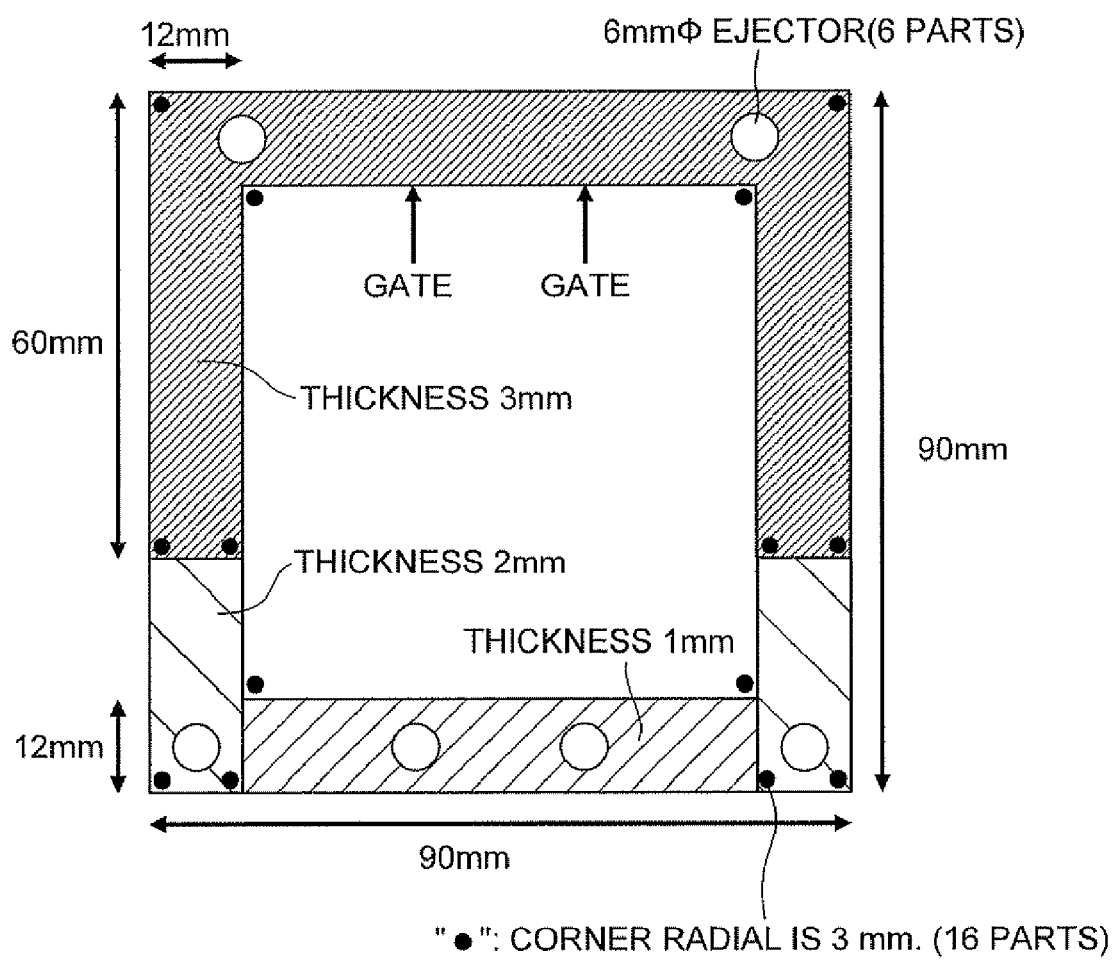
FIG. 2 represents a form of an evaluation sample used in the evaluation of the release property.

The invention claimed is:

1. A polyarylene sulfide resin composition, which comprises polyarylene sulfide (A) and polyamide (B) as essential components, and further comprises an organic phosphorus compound (C), which is selected from the group consisting of an aromatic phosphite compound and an aromatic phosphonate compound, and an inorganic phosphorus compound (D), which is selected from the group consisting from a metal salt of phosphorous acid and a metal salt of hypophosphoric acid, as essential components in addition to the polyarylene sulfide (A) and the polyamide (B).

2. The polyarylene sulfide resin composition according to claim 1, wherein the polyamide (B) is aromatic polyamide which includes terephthalic acid amide as an essential structural unit.

3. The polyarylene sulfide resin composition according to claim 2, wherein the polyamide (B) includes a terephthalamide structure (a) represented by the structural formula a, an isophthalamide structure (b) represented by the structural formula b and an acid amide structure (c) represented by the structural formula c;

Structural formula a

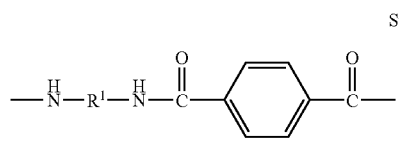

($R^1$ represents an alkylene group having 2 to 12 carbon atoms)

Structural formula b

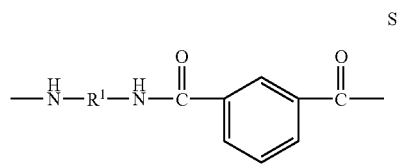

($R^1$ represents an alkylene group having 2 to 12 carbon atoms)

Structural formula c

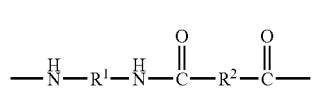

($R^1$ represents an alkylene group having 2 to 12 carbon atoms, and $R^2$ represents an aliphatic hydrocarbon group having 4 to 10 carbon atoms).

4. The polyarylene sulfide resin composition according to claim 3, wherein the polyamide (B) comprises 65 to 70 mol % of the terephthalamide structure (a) represented by the structural formula a, 20 to 25 mol % of the isophthalamide structure (b) represented by the structural formula b and 10 to 15 mol % of the acid amide structure (c) represented by the structural formula c.

5. The polyarylene sulfide resin composition according to claim 1, wherein the polyamide (B) is polyamide 9T or polyamide 46.

6. The polyarylene sulfide resin composition according to claim 1, wherein a mixing ratio of the polyarylene sulfide (A) to the polyamide (B), which is a mass ratio represented by (A)/(B), is 95/5 to 50/50.

7. The polyarylene sulfide resin composition according to claim 1, wherein a mixing ratio of the organic phosphorus compound (C) is in a range of 0.1 to 1 parts by mass based on 100 parts by mass, which are the total of the polyarylene sulfide (A), the polyamide (B), the organic phosphorus compounds (C) and the inorganic phosphorus compound (D).

8. The polyarylene sulfide resin composition according to claim 1, wherein a mixing ratio of the inorganic phosphorus compound (D) is in the range of 0.1 to 1 parts by weight based on 100 parts by mass, which is a total of the polyarylene sulfide (A), the polyamide (B), the organic phosphorus compounds (C) and the inorganic phosphorus compound (D).

9. The polyarylene sulfide resin composition according to claim 1, wherein the polyarylene sulfide (A) has a peak molecular weight in the molecular weigh range of 25000 to 30000, which is evaluated by gel permeation chromatography, has a ratio (Mw/Mn) of the weight average molecular weight (Mw) to the number average molecular weight (Mn) in the range of 5 to 10, and has a non-Newtonian index in the range of 0.9 to 1.3.

10. The polyarylene sulfide resin composition according to claim 1, wherein the chlorine atom content of the polyarylene sulfide (A) is in the range of 1500 to 2000 ppm.

11. The polyarylene sulfide resin composition according to claim 1, further comprising an epoxy silane coupling agent (E), a hydrotalcite compound (F), and a fibrous reinforcing material (G-1) or an inorganic filler (G-2), in addition to the components (A) to (D).

12. The polyarylene sulfide resin composition according to claim 1, further comprising an antioxidant (H), in addition to the components (A) to (D) and (G-1) or (G-2).

13. The polyarylene sulfide resin composition according to claim 1, wherein a recrystallization peak temperature of the polyarylene sulfide (A) is 220° C. or more, and a recrystallization peak temperature of the polyamide (B) is 265° C. or less, which are obtained by measuring differential scanning calorimetry (DSC) of the polyarylene sulfide resin composition.

14. The polyarylene sulfide resin composition according to claim 1, wherein a mixing ratio of the polyamide (B) in the polyarylene sulfide resin composition is 8 to 20% by mass, and an extraction ratio of the polyamide (B) is 7% by mass or less, which is obtained by extraction of the polyarylene sulfide resin composition with hexafluoroisopropanol at 70° C. for 15 minutes.

15. A manufacturing method of the polyarylene sulfide resin composition, which includes;
providing the polyarylene sulfide resin composition according to claim 1 in a double-screw kneading extruder;
melt-kneading the resin composition under the condition that a ratio of a discharge amount (kg/hr) of resin components to a screw rotation rate (rpm) (discharge amount/screw rotation rate) is 0.02 to 0.2 (kg/hr·rpm); and
drawing out the melt-kneaded composition.

16. A surface mount electronic component, which comprises a molded product of the polyarylene sulfide resin composition according to claim 1 and a metal terminal as essential components.

* * * * *